United States Patent [19]

Robinson

[11] 4,217,495
[45] Aug. 12, 1980

[54] ELECTRON MICROSCOPE BACKSCATTERED ELECTRON DETECTORS

[76] Inventor: Vivian N. E. Robinson, 112 Oyster Bay Rd., Oyster Bay, New South Wales 2225, Australia

[21] Appl. No.: 27,066

[22] Filed: Apr. 4, 1979

[30] Foreign Application Priority Data

Apr. 18, 1978 [AU] Australia .................. PD4084

[51] Int. Cl.² ............................................ G01M 23/00
[52] U.S. Cl. .................................. 250/310; 250/311; 250/483
[58] Field of Search ............... 250/310, 311, 483, 360

[56] References Cited

U.S. PATENT DOCUMENTS

| | | | |
|---|---|---|---|
| 2,939,012 | 5/1960 | Scherbatskoy | 250/310 |
| 3,781,562 | 12/1973 | Singh | 250/360 |
| 3,942,005 | 3/1976 | Watanabe | 250/310 |
| 4,149,074 | 4/1979 | Schliepel et al. | 250/311 |

Primary Examiner—Harold A. Dixon
Attorney, Agent, or Firm—David M. Ostfeld

[57] ABSTRACT

An electron microscope backscattered detector comprising an arm of scintillation material with a hole through which the electron beam passes, the hole being provided with a removable grounded liner to facilitate cleaning and prevent astigmatism problems due to electron build up.

11 Claims, 3 Drawing Figures

ELECTRON MICROSCOPE BACKSCATTERED ELECTRON DETECTORS

This invention relates to electron microscope backscattered electron detectors.

Recent research has shown that when a specimen in a scanning electron microscope is bombarded by the electron beam, there are often more backscattered electrons than secondary electrons emitted. Continuing research has shown that this backscattered electron signal can be detected to give an image showing the same small spacing as can be detected with a secondary electron detector. However, in order to take advantage of this greater signal, it is desirable to provide a backscattered electron detector which subtends a wide angle at the specimen, to collect as many backscattered electrons as possible and is efficient in their detection.

It is therefore an object of the present invention to provide a backscattered electron detector which will go at least part of the way towards meeting the foregoing desiderata in a simple yet effective manner or which will at least provide the public with a useful choice.

Accordingly, the invention consists in a backscattered electron detector for use in an electron microscope, said detector comprising an arm of scintillation material adapted to be coupled to a photomultiplier at one end thereof, and incorporating adjacent the opposite end a transverse hole capable of passing the electron beam of said microscope therethrough, said hole having a liner of metallic material capable of being connected to an electrical connection in use.

Notwithstanding any other forms which may fall within its scope, the invention will hereinafter be described in one preferred form by way of example only with reference to the accompanying drawings in which.

Figure 1:
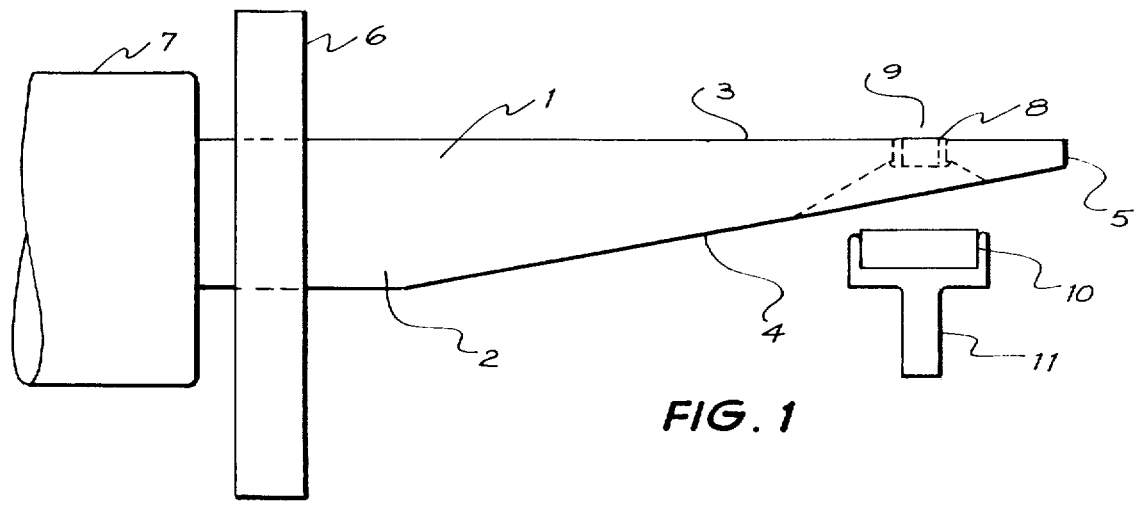
FIG. 1 is a side view of a backscattered electron detector according to the invention.
Figure 2:
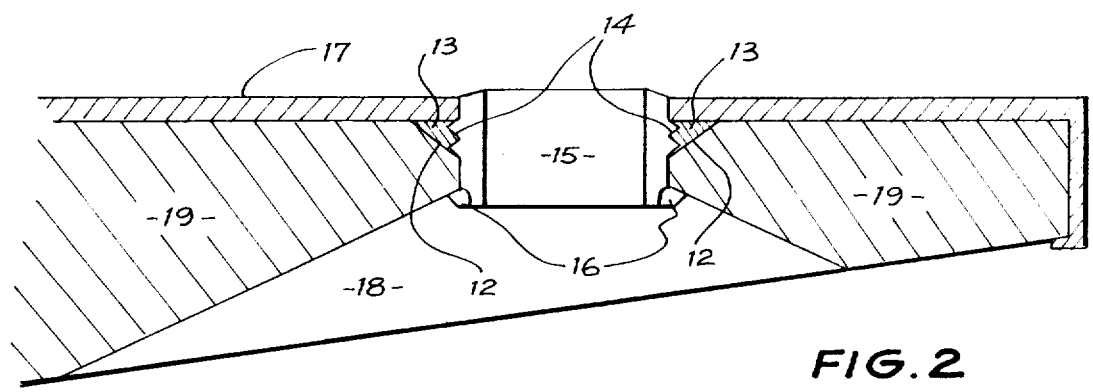
FIG. 2 is a cross-sectional view to an enlarged scale of the tip of the backscattered electron detector shown in FIG. 1.

In the preferred form of the invention a backscattered detector and an alternative construction thereof for use in scanning electron microscopes are constructed as follows:

In the form of the invention as shown in FIGS. 1 and 2, an arm 1 is provided of scintillation material, being any material that emits photons when struck by radiation, the arm having a generally rectangular cross-sectional configuration having a width greater than the depth thereof and having a base portion 2, of greater depth, tapering to a tip portion 5 of lesser depth. Both the upper surface 3 and the lower surface 4 of the arm are generally flat in configuration. The lower surface 4 of the arm is sloped upwardly so that the tip 5 is of rectangular configuration having a width considerably greater than the depth. The arm is supported on a vacuum port mounting flange 6 and connecting to a photomultiplier 7.

Adjacent to the end of the arm, a transverse hole 8 is formed through the scintillator and in use the detector is aligned in the electron microscope so that the electron beam 9 passes downwardly through the hole 8 to irradiate the sample 10 supported on a support stalk 11 below the hole.

The particular configuration of the hole will now be described with reference to FIG. 2. The hole is formed by forming the scintillation material to a conical configuration at an angle of approximately 45 degrees to form a conical depression 12 in the upper surface of the scintillator material. A metallic bush 13 is provided having a conical outer surface corresponding to the conical depression 12 in the scintillator, and a female thread 14 on the inner cylindrical surface of the bush. The bush is fixed into the scintillator for example by gluing with epoxy type resin. A liner 15 is provided having a male thread corresponding to the female thread 14 in the bush, so that the liner may be mounted in the scintillator by screwing the liner into the bush. To facilitate this operation the lower edge of the liner may be provided with two holes or notches 16, capable of being engaged by a suitable tool to screw the liner into the bush. The liner for the hole has a smooth internal bore.

The outer surface of the scintillator arm 1, at least over the upper surface 3 and the sides and tip of the scintillator arm is covered by a metallic coating 17 which is in direct electrical contact with the bush 13 and hence the liner 15 so that the liner, which is of metallic material, and preferably of copper, is capable of being connected to an electrical connection through the bush and the metallic covering 17. In use, a simple ground connection is provided between the base of the metallic cover at the flange 6, and a suitable earth connection.

In use the electrical connection may be to ground or alternatively may be to a D.C. voltage.

The lower surface of the scintillator arm is cut away at 18, so that the specimen mounted beneath the arm, may more closely approach the hole 8 so that the electrons backscattered from the sample may be more readily collected by the scintillation material.

Figure 3:
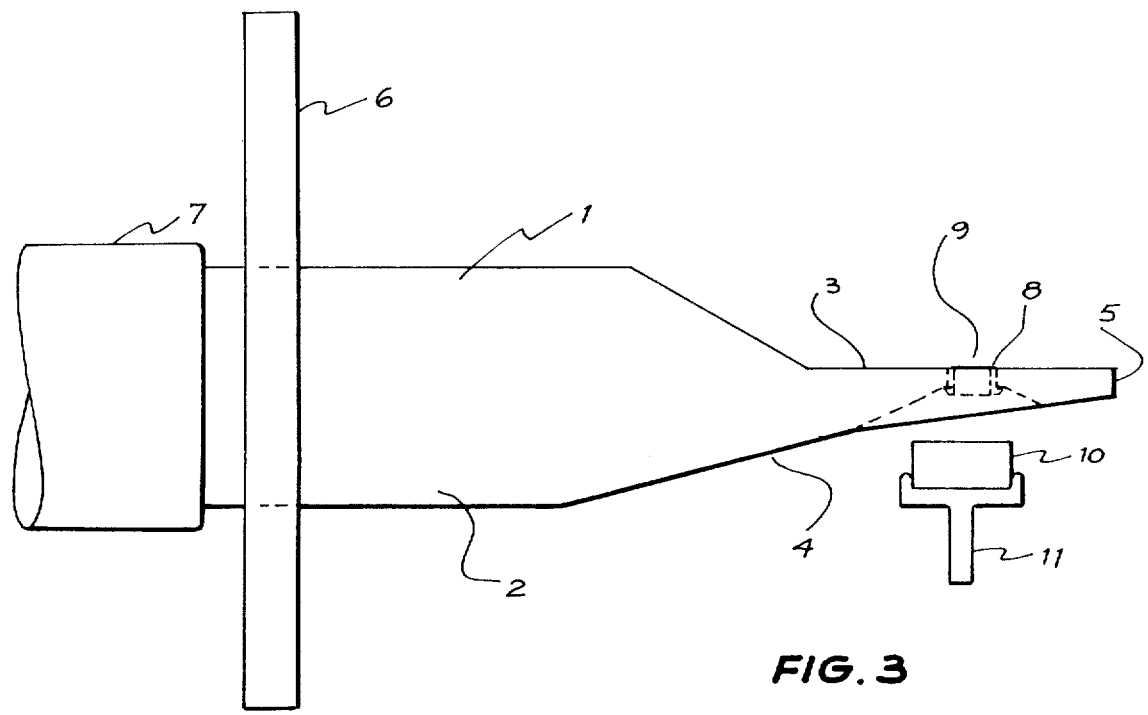
FIG. 3 is a side view of an alternative form of the backscattered electron detector shown in FIG. 1 using like numerals for reference to like parts.

In alternative forms of the invention, the scintillator arm may take various different configurations to suit different types of electron microscopes and different applications to which the detector may be applied. One alternative configuration is shown in FIG. 3, in which the arm 1 has a generally circular cross-sectional configuration over the base portion 2 and has a flat surfaced upper portion 3, cut away from the upper surface of the circular arm forming a flat platform at this point. The lower surface 4 of the arm is sloped upwardly so that the tip 5 has a substantially rectangular configuration having a breadth considerably greater than the thickness. Other features of this configuration are the same as shown in the configuration in FIG. 1 and are referenced with like numerals.

The particular configuration of the scintillator arm is such that the backscattered electrons as emitted from the specimen can be detected over a solid angle between $0.3\pi$ steradian and $1.9\pi$ steradian.

In use of the backscattered electron detector, a sample 10 is mounted as previously described and irradiated by an electron beam 9, passed through the liner 15 in the hole 8. The backscattered electrons from the specimen pass into the scintillation material 19 which emits photons which pass to the photomultiplier 7, and are read out as is common in electron microscope technology.

It has been found in the past, when using backscattered electron detectors that the hole 8 must be kept to a large size, as otherwise the concentration of the electron beam 9 passing through the hole causes firstly a build up of electrons on the surface of the scintillation material which gives astigmatism problems, and secondly a build up of oil deposits which are carried by the electron beam, from the vacuum pump of the electron microscope. The present invention enables a much smaller hole to be used which has the advantage that higher percentages of the backscattered electrons from the specimen are collected in the scintillation material, whereas with a large hole a high percentage of the backscattered electrons pass back upwardly through the hole and are lost to the detector.

The smaller hole of the invention, having a diameter of less than 15 millimeters and preferably of less than 10 millimeters, is able to be achieved by providing a liner to the hole which is earthed to conduct away any electrons which may build up around the hole from the electron beam 9. The conducting away of the electrons prevents astigmatism problems which would otherwise be present. Any build up of oil deposits on the interior surface of the liner 15 may be readily cleaned by simply removing the liner from the bush 13 and replacing with a clean liner. The contaminated liner may then be cleaned at leisure which allows efficient and continued use of the electron microscope.

In this matter, an improved backscattered electron detector is provided, which by virtue of having a removable liner in the hole through the scintillator, which is earthed to an electrical ground connection, enables a hole considerably smaller than has previously been possible to be used with attendant advantages in improved output from the scintillator to the photomultiplier.

What I claim is:

1. A backscattered electron detector for use in an electron microscope, said detector comprising an arm of scintillation material adapted to be coupled to a photomultiplier at one end thereof and incorporating adjacent the opposite end a transverse hole capable of passing the electron beam of said microscope therethrough, said hole having a liner of metallic material capable of being connected to an electrical connection in use.

2. A backscattered electron detector as claimed in claim 1 wherein said liner is readily removable from said hole.

3. A backscattered electron detector as claimed in claim 2 wherein a bush of metallic material is provided fixed to said scintillation material within said hole, said bush being provided with a female thread and said liner being provided with a corresponding male thread so that said liner is removable by unscrewing said liner from said bush.

4. A backscattered electron detector as claimed in claim 3 wherein said bush is fixed to said scintillation material by gluing with an epoxy type resin.

5. A backscattered electron detector as claimed in claim 1 wherein said arm is provided with a metallic covering over at least the upper surface of said arm, and said electrical connection from said liner is made through said metallic covering.

6. A backscattered electron detector as claimed in claim 5 wherein said arm is generally rectangular in cross-section and said metallic covering extends over the upper surface and the sides and tip of said arm.

7. A backscattered electron detector as claimed in claim 1 wherein said scintillation material is cut away in a cone-like configuration beneath said liner.

8. A backscattered electron detector as claimed in claim 1 wherein the bore through said liner is less than 15 millimeters in diameter.

9. A backscattered electron detector as claimed in claim 8 wherein said bore is less than 10 millimeters in diameter.

10. A backscattered electron detector as claimed in claim 1 wherein the scintillation material subtends a solid angle at the specimen of between $0.8\pi$ steradian and $1.8\pi$ steradian.

11. A backscattered electron detector as claimed in claim 1 wherein said electrical connection is an earthed connection.